United States Patent [19]

Rops

[11] Patent Number: 4,853,629

[45] Date of Patent: Aug. 1, 1989

[54] HALL-EFFECT POSITION SENSING SYSTEM AND DEVICE

[75] Inventor: Paul G. Rops, Plainwell, Mich.

[73] Assignee: Eaton Corporation, Cleveland, Ohio

[21] Appl. No.: 189,875

[22] Filed: May 2, 1988

[51] Int. Cl.⁴ .............................................. G01B 7/14
[52] U.S. Cl. ................................. 324/208; 307/309;
324/251; 324/174; 324/117 H; 338/32 H
[58] Field of Search ............... 324/208, 207, 251, 173,
324/174, 117 H, 235; 307/309; 338/32 H

[56] References Cited

U.S. PATENT DOCUMENTS

| | | | |
|---|---|---|---|
| 4,110,676 | 8/1978 | Edick et al. | 324/174 X |
| 4,359,895 | 11/1982 | Wolff et al. | 324/208 |
| 4,369,405 | 1/1983 | Sato et al. | 324/174 |
| 4,374,333 | 2/1983 | Avery | 307/309 |
| 4,529,932 | 7/1985 | Doueihi et al. | 324/174 X |
| 4,551,715 | 11/1985 | Durbin | 324/174 X |
| 4,644,788 | 2/1987 | Boucher | 324/174 X |
| 4,670,715 | 6/1987 | Fuzzell | 324/174 X |
| 4,771,866 | 9/1988 | Heideman et al. | 338/32 H X |

Primary Examiner—Reinhard J. Eisenzopf
Assistant Examiner—Robert W. Mueller
Attorney, Agent, or Firm—A. E. Chrow

[57] ABSTRACT

A Hall-Effect position sensing system is provided that is particularly advantageous for use in vehicular applications such as for sensing position of a transmission gear change shift rail by requiring only a single power conductor (34) between a Hall-Effect switch device (90) and a remote power source (20) such as a battery by connecting a signal output terminal (16) of device (90) to conductor (34) in close proximity to device (90) and including a drop resistor ($r_1$) such that a micro-processor (24) is able to provide an output control signal (32) indicative of position by monitoring the effect of the output signal of device (R) on conductor (34).

17 Claims, 3 Drawing Sheets

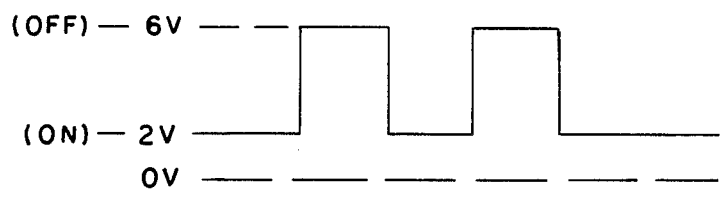
_Fig. 4_
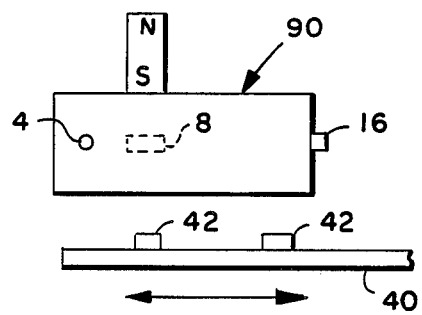
_Fig. 5_
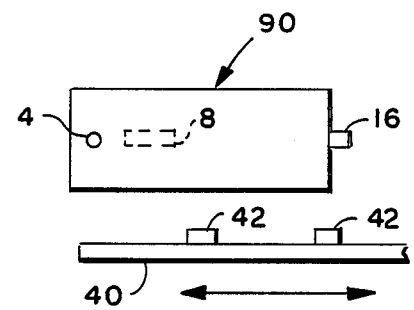
_Fig. 6_
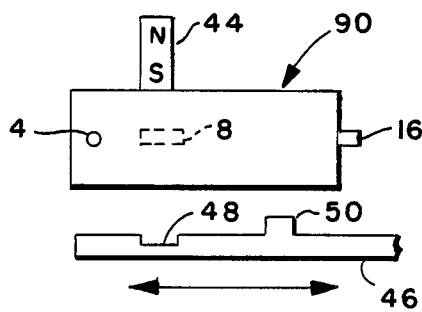
_Fig. 7_
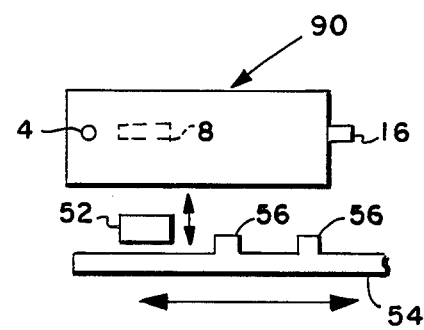
_Fig. 8_

HALL-EFFECT POSITION SENSING SYSTEM AND DEVICE

INTRODUCTION

This invention relates generally to a Hall-Effect switch device and electrical circuit system for determining position of a movable component such as one or more gear shift positions of a vehicular transmission shift rail and more particularly to the use of Hall-Effect switch devices in conjunction with an electrical circuit that requires only a singular conductor for conveying electrical power thereto from a remote power source as well as to a Hall-Effect switch device that is advantageously adapted to provide an output signal in response to predetermined movement of a component such as a vehicular transmission shift rail.

BACKGROUND OF THE INVENTION

Hall-Effect switch devices are well known to those skilled in the art. Such devices normally include: a voltage regulator; a sensing element effective to sense disruption of magnetic field flux and changes in intensity of a magnetic field; an amplifier operative to amplify a signal provided by the sensing element, and; a switch member, such as a thyristor, operative to actuate and provide an output signal when the magnetic field flux in predetermined proximity to the sensing element is disrupted by a predetermined amount and when the magnetic field intensity to which the sensing element is exposed is increased above a value predetermined for actuating the switch member.

As such, Hall-Effect switch devices can be advantageously used to provide an output signal that can be received and processed by processing means such as a micro-processor well known to those skilled in the art operative to provide information relative the position of the component in response to a selected one of conditions: (a) disruption by a predetermined amount of a magnetic field of a magnet secured to the switch device in response to the component including a ferrous material thereupon having been moved into predetermined proximity to the sensing element; (b) exposure of the sensing element to a magnetic field above a predetermined amount provided by a magnet secured to the component having a magnetic field intensity that increases in a direction theretowards that has been moved by the component into predetermined proximity to the sensing element; (c) disruption by a predetermined amount of a magnetic field of a magnet secured to the switch device in response to an irregularity in the surface of the component having been moved by the component thereacross in predetermined proximity to the sensing element; (d) exposure to a magnetic field intensity above a predetermined amount provided by a magnet having a magnetic field intensity that increases in a direction theretowards that has been moved by the component into predetermined proximity to the sensing element, and; (e) disruption by a predetermined amount of a magnetic field of a magnet secured to the switch device in response to the component being made from a ferrous material and having an irregularity in the surface thereof having been moved across the magnetic field in predetermined proximity to the sensing element.

Hall-Effect switch devices are available from many commercial sources and have been miniaturized to the point where they are contained on a single silicon chip and are commercially available with sensing elements responsive to different levels of magnetic field intensity.

Hall-Effect switch devices are characteristically electrically grounded and powered by a constant-voltage power source that is connected by means of an electrical conductor to a singular power input terminal on the device. The devices also characteristically feature a singular output terminal to which an electrical conductor is connected for conveying the switch member output signal to the means for processing the signal and providing information therefrom previously described.

Characteristically the power sources and means for processing the output signal have been located remotely from the device often mandating the necessity and expense in having to make long runs of both the power input and output signal conductors as well as including a ground wire in instances when the device is electrically grounded remotely therefrom.

In contrast to the above, the instant invention provides a system utilizing such Hall-Effect switch devices in conjunction with an electrical circuit whereby the output signal terminal is connected to the power input conductor in close proximity to the device and the effect of the output signal upon the power input conductor is monitored and processed by the processing means thereby eliminating the need for long runs of two conductors and often eliminating the ground wire where the device is electrically grounded remotely therefrom. Such is particularly advantageous where the movable component is a vehicular transmission shift rail and the power source is a battery located on the vehicle remotely therefrom.

Additionally, in conjunction with conditions (d) previously described, a problem has characteristically heretofore existed in insuring accurate movement of the magnet towards and away from the sensing element which is addressed herein by including a resilient biasing means, such as a coiled spring, and at least one movable member in an open-ended bore provided in the device that are collectively operative to accurately control movement of the magnet towards and away from the sensing element in response to movement of the component.

SUMMARY OF THE INVENTION

Accordingly, it is an object of this invention to provide a Hall-Effect device and circuit system operative to determine the position of a movable component.

It is another object of this invention to provide a Hall-Effect device and circuit system that utilizes a power input conductor from a remote power source to convey an output signal therefrom to a remote means for monitoring and processing the signal and providing information therefrom for determining the position of a movable component.

It is still another object of this invention to provide a Hall-Effect switch device that utilizes resilient biasing means and at least one movable member that collectively insure accurate movement of a magnet towards and away from a sensing element of the device arising from movement of a movable component.

BRIEF DESCRIPTION OF THE DRAWINGS

FIG. 4 is a graph of voltage on a power input conductor used in the system of FIG. 3;

FIGS. 5-8 are respective schematic diagrams showing respective conditions under which switch device 90 may be actuated to provide an output signal.

DESCRIPTION OF SOME PREFERRED EMBODIMENTS

Figure 1:
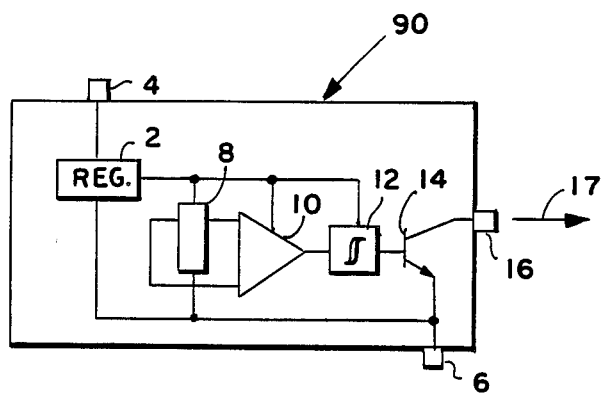
FIG. 1 is a diagramatic plan view of a Hall-Effect switch device 90.

Hall-Effect switch device 90 is a commercially available integrated switch device. Device 90 has a voltage regulator 2 electrically connected to a power input terminal 4 and a ground terminal 6. Regulator 2 is also connected to a sensing element 8 and an amplifier 10 and a Schmidt trigger 12 which in turn are electrically connected together as shown in FIG. 1. Trigger 12 is connected to a switch member 14, such as a thyristor, which in turn is connected to output terminal 16.

The operation of device 90 is well known to those skilled in the art and is fundamentally governed by sensing element 8 which is responsive to both magnetic field intensity changes and disruption of magnetic field flux which, if above a predetermined level, provides a signal that is amplified by amplifier 10 and thence passes through trigger 12 which is operative to actuate switch member 14 and provide an output signal 17 at output terminal 16 of device 90.

Figure 2:
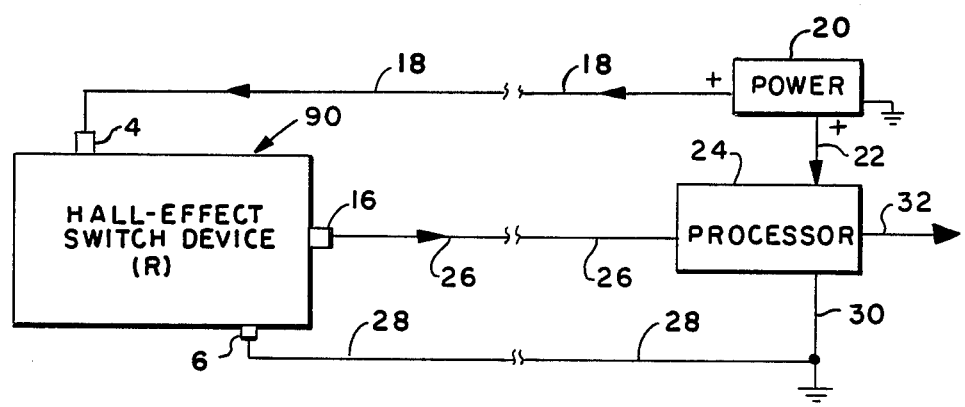
FIG. 2 is a schematic diagram of a prior art circuit used with switch device 90 of FIG. 1.

Device 90 is operative to provide electrical output signal 17 whenever switch member 14 is actuated by sensing element 8 whenever the intensity of a magnetic field to which sensing element 8 is exposed increases above a predetermined value (gauss) and whenever magnetic flux of a magnetic field in which sensing element 8 is in predetermined proximity to is disrupted by a predetermined amount. In FIG. 2, device 90 is connected to a remote power source 20 and processor 22 in a conventional prior art manner.

Power source 20 is a substantially constant-voltage power source such as provided by a 12 volt battery. In vehicles, the battery is apt to be remotely located from device 90 requiring a long electrical conductor 18 for conveying electrical power to input terminal 4 of device 90.

Likewise, output signal 17 is conveyed by conductor 26 from output terminal 16 to processing means such as micro-processor 24 which is apt also to be located remotely from device 90 and is an electronic module, well known to those skilled in the art, operable to receive and process signal 17 and provide information by means of an output signal 32 therefrom relative position of a movable component whose movement has provided either the threshold magnitude field intensity or disruption of magnitude flux required by sensing element 8 to actuate switch member 14 as previously described.

Processor 24 may be of the type that also can be powered by power source 20 as illustrated by electrical conductor 22 connected therebetween. Device 90 and processor 24 may be electrically grounded separately or an electrical conductor 28 may be connected to both ground terminal 6 of device 90 and ground connector 30 of processor 24 as shown in FIG. 2 which ground may be a vehicular chassis frame where device 90 is used to monitor movement of a movable vehicular component such as a transmission shift rail.

Thus, prior art circuitry has required long runs of both power input conductor 18 and output signal conductor 26 between device 90 and power source 20 and processor 24 with both conductors 18 and 26 preferably electrically insulated and contained in a wiring harness which may further include ground conductor 28 where device 90 is grounded remotely.

Figure 3:
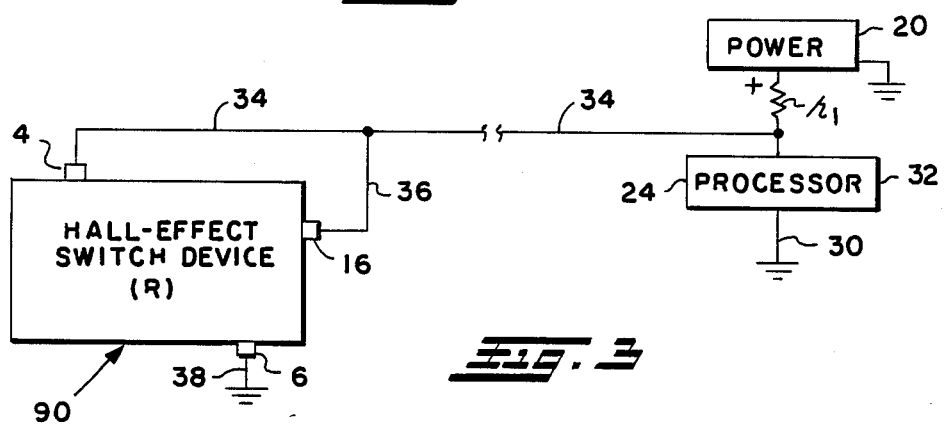
FIG. 3 is a schematic diagram of switch device 90 and circuit providing the system of the invention.

Letter "R" in FIGS. 2 and 3 depicts inherent load resistance of device 90 which decreases from a higher to a lower value when switch member 14 is actuated and which increases from the lower value to the higher value when switch member 14 is deactuated as previously described. In FIG. 3, the system of the invention is provided by eliminating the connection between output terminal 26 and processor 24 provided by conductor 26 in the manner hereinafter described. Conductor 34 extends between power source 20 and power input terminal 4 of device 90 and includes a drop resistor "r" between terminal 4 and power source 20 having a predetermined resistance.

Output terminal 16 of device 90 is connected to conductor 34 by means of conductor 36 between drop resistor "r" and input terminal 4 in close proximity to device 90. Conductor 36 may be directly connected to terminals 4 and 16 when convenient.

Processor 24 is connected to conductor 34 between drop resistor "r", and the point at which conductor 36 is connected to conductor 34. Device 90 is grounded by means of conductor 38 extending to ground from ground terminal 6 and processor 24 is grounded by means of ground conductor 30 connected to ground such that the need for ground conductor 28 of FIG. 1 is eliminated.

In operation, processor 24 is operable to monitor voltage on power input conductor 34 and provide information in the form of output signal 32 therefrom previously described. The decrease in load resistance "R" of device 90 when switch member 14 is actuated causes a higher electrical current to flow through drop resistor "r" which causes a decrease in the voltage on conductor 34 being monitored by processor 24. Conversely, when switch member 14 is not actuated, the higher load resistance "R" of device 90 reduces electrical current flow through drop resistor "r" which increases the voltage on conductor 34 being monitored by processor 24.

By way of example, the graph of FIG. 4 illustrates the change in voltage on power input conductor 34 where the power source is a 12 volt battery and drop resistor "r" has a resistance of about 2,000 ohms and device 90 is a standard Hall-Effect digital switch device having Model No. UGS-3020T manufactured by Sprague Products Company. When switch member 14 of device 90 is deactuated (off), the line voltage on conductor 34 is about 6 volts. When switch member 14 is actuated (on) the line voltage on conductor 34 is about 2 volts. Additionally, the circuit means of the invention enables convenient troubleshooting since an opening in conductor 34 will reduce current flow through conductor 34 to zero resulting in 12 volts at the input to processor 24 which can be measured. A short to ground will increase current flow through drop resistor "r" and result in about a zero line voltage on conductor 34 being monitored by processor 24.

FIG. 5 illustrates previously described conditions (a) in which a magnet 5 is secured to device 90 in predetermined proximity to sensing element 8. Commonly, south pole "S" of the magnet is closest to sensing element 8. As used herein, the word "magnet" includes both permanent and electro-magnets with the former most commonly employed. A movable object such as a vehicular transmission shift rail 40 has a ferrous material 42 thereupon corresponding to respective gear shift positions. Movement of material 42 across the magnetic flux lines of magnet 5 in predetermined proximity to sensing element 8 disrupts the field sufficiently to actuate switch member 14 at locations corresponding to the gear shift positions.

FIG. 6 illustrates conditions (b) previously described where a vehicular transmission shift rail 40 has magnets 42 secured thereto at spaced-apart positions corresponding to gear shift positions. Magnets 42 have a magnetic field intensity that increases in a direction theretowards such that when moved into predetermined proximity to sensing element 8 provide a field intensity that is higher than the intensity required to actuate switch member 14.

FIG. 7 illustrates both conditions (c) and (e) previously described where, for both conditions, a magnet 44 is secured in predetermined proximity to sensing element 8 and: for conditions (c) a transmission rail 46, not made from a ferrous material, has an irregularity such as slot 48 or protuberance 50 that cut across the magnetic field flux lines in predetermined proximity to sensing element 8 upon movement of rail 40, and; for conditions (e) rail 46 itself is made from a ferrous material having irregularity such as a slot 48 or protuberance 50 that cut across the magnetic field flux lines in predetermined proximity to sensing element 8.

Figure 9:
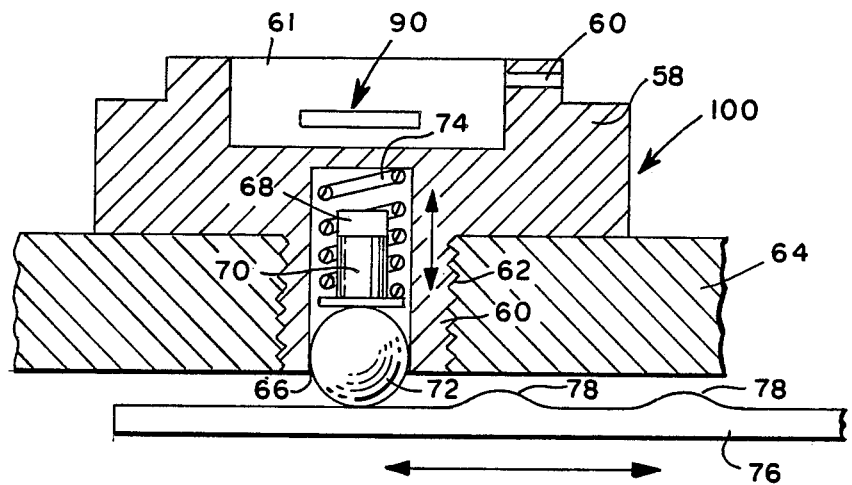
FIG. 9 is a cross-sectional view of a Hall-Effect switch device 100 of the invention.

FIG. 8 illustrates conditions (d) previously described where a vehicular transmission shift rail 54 is provided with protuberances 56 respectively corresponding to particular gear shift positions that upon movement of rail 54 in the opposite directions shown by the arrows are operable to move magnet 52 towards sensing element 8 for a distance sufficient to increase the magnetic field intensity to which sensing element 8 is exposed to above a threshold level required to actuate switch member 14 of which a particular preferred embodiment is hereinafter described with respect to switch device 100 of FIG. 9.

In FIG. 9, device 100 includes a housing 58 in which previously described Hall-Effect switch device 90 is disposed in an opening 61 therein and preferably sealed therein by a suitable potting compound. A channel 60 is provided through housing 58 for making the electrical connections described with respect to FIGURES 2 and 3 and preferably the latter.

Housing 58 has a hub 60 extending downwardly in FIG. 1 that is provided with external threads 62 for threaded engagement in a threaded bore (not referenced) of support frame 64.

Housing 58 has an open-ended bore 66 therein extending through hub 60 in which a magnet 68; a first movable member 72; and a second movable member 70 are movably disposed. Bore 66 is aligned to confine movement of magnetic 68 and movable members 70 and 72 in a direction away from and towards switch device 90.

Resilient biasing means such as coiled spring 74 is disposed in bore 66 between a shoulder on movable member 70 and the closed end of bore 66 adjacent switch device 90. Spring 74 is preferably made from a non-ferrous material such as brass or a suitable plastic.

Movable members 70 and 72 are preferably made from a non-ferrous material such as brass and magnet 68 is secured to movable member 70. Spring 74 is operative to urge movable member 70 and magnet 68 away from switch device 90 for a predetermined distance sufficient to keep the magnetic field intensity of magnet 68 to which sensing element 8 (not shown) is exposed below the threshold value required to actuate switch member 14.

Spring 74 is also operative to cause movable member 70 to engage and urge movable member 72 away from switch device 90 such that a portion thereof is exposed at the open end of bore 66.

A movable component such as a vehicular transmission shift rail 76 is provided with spaced-apart protuberances 78 that correspond to particular gear shift positions that, upon movement of rail 76 in the direction shown by the arrows, are operable to engage the exposed portion of movable member 72 and overcome the downward biasing force of spring 74 and urge member 72 against movable member 70 and thereby move movable member 70 and magnet 68 towards switch device 90 for a distance predetermined to increase the magnetic field intensity provided by magnet 68 to which the sensing element of switch device 90 is exposed to a value above the predetermined amount required to actuate the switch member 14 of switch device 90.

Although two non-ferrous members (70 and 72) are shown in FIG. 9, variations may be employed where only one non-ferrous movable member is employed for moving magnet 68 towards switch device 90 upon engagement with protuberances 78 and away from switch device 90 upon disengagement therewith.

Although not shown in the drawings, magnetic field concentrators, well known to those skilled in the art, may be included where desired to concentrate the magnetic field intensity and are considered to be included as part of the invention. Such concentrators are commonly cone shaped and are commonly disposed intermediate the magnet and the Hall-Effect switch device with their broadest base facing towards the switch device.

What is claimed is:

1. A system for determining position of a movable component, said system comprising:
a Hall-Effect switch device electrically connected to ground and having an input terminal for receiving electrical power from a remote substantially constant-voltage power source, said device having an output terminal operative to provide an output signal therefrom upon actuation of a switch member thereof in response to movement of the component to a predetermined position, and said device having an electrical load resistance that decreases from a higher value to a lower value upon actuation of the switch member and that increases from the lower value to the higher value upon deactuation of the switch member;

circuit means, said means comprising;

an electrical input conductor connecting the power source to the switch device input terminal for conveying the electrical power thereto and including a drop resistor having a predetermined resistance interposed between the power source and the input terminal and means for connecting the switch device output terminal directly to the input conductor in close proximity to the switch device between the input terminal thereof and the drop resistor; and processor means electrically connected to ground and to the input conductor between the drop resistor and the connection between the switch device output terminal and the input conductor and adapted to monitor the value of voltage on the input conductor and provide information indicative of the position of the movable member therefrom, said system operative such that;

(1) when the switch member is actuated, the lower load resistance of the switch device causes current flow through the drop resistor to increase and cause a lower voltage on the input conductor being monitored by the processor means, and (2) when the switch member is deactuated, the higher load resistance of the switch device causes current flow through the drop resistor to decrease and cause a higher voltage on the input conductor being monitored by the processor means.

2. The system of claim 1 wherein the movable component is a vehicular transmission shift rail and the switch member is actuated by movement thereof to at least one gear shift position.

3. The system of claim 1 wherein the switch member is actuated in response to conditions (b) and the component is a vehicular transmission shift rail having the magnet secured thereto at a location corresponding to at least one gear shift position thereof.

4. The system of claim 1 wherein the switch member is actuated in response to conditions (c), the component is a vehicular transmission shift rail, and the irregularity is a protuberance extending from the shift rail corresponding to at least one gear shift position thereof.

5. A system for determining position of a movable component, said system comprising:

a Hall-Effect switch device having a sensing element, said device electrically connected to ground and having an input terminal for receiving electrical power from a remote substantially constant-voltage power source and having an output terminal operable to provide an output signal therefrom upon actuation of a switch member thereof in response to a selected one of conditions: (a) disruption by a predetermined amount of a magnetic field of a magnet secured to the switch in response to the component including a ferrous material thereupon having been moved by the component into predetermined proximity to the sensing element, (b) exposure of the sensing element to a magnetic field intensity above a predetermined amount provided by a magnet secured to the component having a magnitude field intensity that increases in a direction theretowards that has been moved by the component into predetermined proximity to the sensing element; (c) disruption by a predetermined amount of a magnetic field of a magnet secured to the device in response to an irregularity in the surface of the component having been moved by the component thereacross in predetermined proximity to the sensing element; (d) exposure to a magnetic field intensity above a predetermined amount provided by a magnet having a magnetic field intensity that increases in a direction theretowards that has been moved by the component into predetermined proximity to the sensing element; and (e) disruption by a predetermined amount of a magnetic field of a magnet secured to the switch device in response to the component being made from a ferrous material and having an irregularity in the surface thereof having been moved across the magnetic field by the component in predetermined proximity to the sensing element, said device having an electrical load resistance that decreases from a higher value to a lower value upon actuation of the switch member and that increases from the lower value to the higher value upon deactuation of the switch member;

circuit means, said means comprising;

an electrical input conductor connecting the power source to the switch device input terminal for conveying the electrical power thereto and including a drop resistor having a predetermined resistance interposed between the power source and the input terminal and mean for connecting the switch device output terminal directly to the input conductor in close proximity to the switch device between the input terminal thereof and the drop resistor; and processor means electrically connected to ground and to the input conductor between the drop resistor and the connection between the switch device output terminal and the input conductor and operable to monitor and process the value of voltage on the input conductor and provide information indicative of the position of the component therefrom, said system operative such that;

(1) when the switch member is actuated, the lower load resistance of the switch device causes current flow through the drop resistor to increase and cause a lower voltage on the input conductor being monitored by the processor means, and (2) when the switch member is deactuated, the higher load resistance of the switch device causes current flow through the drop resistor to decrease and cause a higher voltage on the input conductor being monitored by the processor means.

6. The system of claim 5 wherein the switch member is actuated in response to conditions (c), the component is a vehicular transmission shift rail, and the irregularity is a slot in the shift rail corresponding to at least one gear shift position thereof.

7. The system of claim 5 wherein the switch member is actuated in response to conditions (d) and the component is a vehicular transmission shift rail operable to move the magnet at a position corresponding to at least one gear shift position thereof.

8. The system of claim 5 wherein the switch member is actuated in response to conditions (a) and the component is a vehicular transmission shift rail and the ferrous material is positioned thereupon at a location corresponding to at least one gear shift position thereof.

9. The system of claim 5 wherein the switch member is actuated in response to conditions (d), the component is a vehicular transmission shift rail having a protuberance extending therefrom corresponding to at least one gear-shift position, at least one movable member is interposed between the magnet and the shift rail, and the device includes resilient biasing means operative to urge the magnet away from the sensing element for a distance sufficient to reduce the magnetic field intensity to which the sensing element is exposed to a value less than the amount predetermined for actuating the switch member and to urge the movable member against the shift rail such that movement of the shift rail causes the protuberance to engage the movable member and thereby cause the movable member to move the magnet towards the sensing element for a distance sufficient to increase the magnetic field intensity to which the sensing element is exposed to a value above the amount predetermined for actuating the switch member.

10. The system of claim 5 wherein the switch member is actuated to response to conditions (e), the component is a vehicular transmission shift rail, and the irregularity is a slot in the shift rail corresponding to at least one gear shift position thereof.

11. The system of claim 1 or 5 wherein the power source is a 12 volt battery and the resistance of the drop resistor is about 2,000 ohms.

12. The system of claims 1 or 5 wherein the switch device output terminal is connected to the input terminal to provide the means for connecting the input conductor to the output terminal.

13. The system of claims 1 or 5 wherein the switch device is connected to ground in close proximity thereto.

14. The system of claims 1 or 5 wherein the switch device is connected to ground by means of an electrical conductor extending through a harness containing the input conductor to a ground connecting terminal therefor remote from the switch device.

15. A Hall-effect switch device for determining position of a movable component having at least one protuberance extending therefrom at a at least one location therealong, said device powered by substantially constant-voltage power source having a drop resistor having a predetermined resistance connected thereto that is connected by an input conductor to a power input terminal of the switch device and including, a sensing element, a switch member, and a movable magnet having a magnetic field whose intensity decreases in a direction away therefrom, with the switch member operative to provide an electrical output signal therefrom that is conveyed directly to the input conductor in close proximity to the switch device between the input terminal thereof and the drop resistor in response to the magnet having been moved into predetermined proximity to the sensing element such that the magnetic field intensity to which the sensing element is exposed exceeds a predetermined amount, and means for moving the magnet, said means comprising;

an open-ended bore in the device in which the magnet is movably disposed, said bore oriented relative the sensing element so as to confine movement of the magnet towards and away therefrom, at least one movable member disposed in the bore intermediate the magnet and the bore open-end, and resilient biasing means disposed within the bore and operative to urge the magnet away from the sensing element for a distance sufficient to decrease the magnetic field intensity thereof to which the sensing element is exposed to a value below the amount predetermined for actuating the switch member and to expose a portion of the movable member at the bore open-end that engages the component protuberance upon predetermined movement of the component is urged thereby against the magnet and causes the magnet to move towards the sensing element for a distance sufficient to increase the magnetic field intensity to which the sensing element is exposed to a value above the amount predetermined for actuating the switch member.

16. The device of claim 15 including a second movable member that is secured to the magnet and is disposed intermediate the magnet and the first movable member and is operable to move the magnet towards the sensing element in response to movement of the first movable member theretowards upon engagement between the first movable element and the component protuberance.

17. The device of claim 15 or 16 wherein the component is a vehicular transmission shift rail and the protuberance corresponds to a gear shift position thereof.

* * * * *